(12) United States Patent
Kojima

(10) Patent No.: US 7,535,283 B2
(45) Date of Patent: May 19, 2009

(54) GATE DRIVE CIRCUIT, SEMICONDUCTOR MODULE AND METHOD FOR DRIVING SWITCHING ELEMENT

(75) Inventor: Tsutomu Kojima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/337,612

(22) Filed: Jan. 24, 2006

(65) Prior Publication Data

US 2006/0181831 A1 Aug. 17, 2006

(30) Foreign Application Priority Data

Feb. 16, 2005 (JP) ............................. 2005-039320

(51) Int. Cl.
*G05F 1/10* (2006.01)
(52) U.S. Cl. .................. 327/538; 327/108; 327/427; 327/434; 327/435
(58) Field of Classification Search ................. 327/108, 327/112, 427, 430, 432–435
See application file for complete search history.

(56) References Cited

U.S. PATENT DOCUMENTS

| | | | | |
|---|---|---|---|---|
| 5,485,341 | A * | 1/1996 | Okado et al. .................. 361/98 |
| 5,929,665 | A * | 7/1999 | Ichikawa et al. ............. 327/109 |
| 6,057,728 | A * | 5/2000 | Igarashi ....................... 327/546 |
| 6,271,709 | B1 * | 8/2001 | Kimura et al. ............... 327/380 |
| 6,411,133 | B1 | 6/2002 | Matsudai et al. .............. 327/65 |
| 6,518,791 | B2 | 2/2003 | Kojima et al. ................. 326/82 |
| 6,717,785 | B2 * | 4/2004 | Fukuda et al. ............. 361/93.1 |
| 7,046,073 | B2 * | 5/2006 | Mayama et al. ............ 327/434 |
| 7,068,082 | B2 * | 6/2006 | Kojima ....................... 327/108 |
| 2005/0017787 | A1 | 1/2005 | Kojima ....................... 327/432 |
| 2005/0089217 | A1 | 4/2005 | Nakagawa et al. .......... 382/162 |
| 2006/0066270 | A1 * | 3/2006 | Kumagai et al. ............ 318/139 |

FOREIGN PATENT DOCUMENTS

JP 2000-286687 10/2000

\* cited by examiner

*Primary Examiner*—Tuan Lam
*Assistant Examiner*—Hiep Nguyen
(74) *Attorney, Agent, or Firm*—Oblon, Spivak, McClelland, Maier & Neustadt, P.C.

(57) ABSTRACT

There is provided with a gate drive circuit including: a first switching element connected at one end to a power terminal; a second switching element connected at one end to the other end of the first switching element and connected at the other end to a reference terminal; a gate voltage output terminal which supplies a voltage at a node between the first switching element and the second switching element to a drive switching element as an output gate voltage; a gate voltage monitoring circuit which monitors the output gate voltage; an overcurrent detection circuit which monitors a current through the drive switching element; and a control circuit which generates a control voltage for controlling impedance of the second switching element based on an on/off signal for indicating that the drive switching element should be turned on/off, a gate voltage monitoring signal and an overcurrent monitoring signal.

20 Claims, 9 Drawing Sheets

GATE DRIVE CIRCUIT, SEMICONDUCTOR MODULE AND METHOD FOR DRIVING SWITCHING ELEMENT

CROSS-REFERENCE TO RELATED APPLICATIONS

This application claims the benefit of priority under 35USC §119 to Japanese Patent Application No. 2005-39320 filed on Feb. 16, 2005, the entire contents of which are incorporated herein by reference.

BACKGROUND OF THE INVENTION

In order to drive a switching element used in an inverter or the like, a drive circuit which drives the switching element on the basis of an on/off signal input from an external control system is used.

In general, in order to prevent an excessive current from flowing through a switching element due to an accident such as short of load circuit and destroying the switching element, means which cut off the switching element to protect the switching element and a load circuit when an overcurrent has occurred is provided in the drive circuit. If the switching element is cut off according to an ordinary method when an overcurrent has occurred, however, large di/dt is generated and a surge voltage of Ldi/dt occurs due to inductance L of wiring or the like. The surge voltage exceeds the withstand voltage of the switching element and the element is destroyed, in some cases. Therefore, a function of preventing an element from being destroyed by a surge voltage based on large di/dt when an overcurrent has been generated by, for example, short of load circuit is desired.

Furthermore, at the time of off operation for turning off the switching element and in the off-state of the switching element, there is a fear that a gate voltage will be raised by charge stored on collector-gate capacitance of the switching element (IGBT etc.) and the switching element will falsely turn on. Therefore, the drive circuit is demanded to have a function of preventing such false turning on as well.

If a change of the gate voltage of the switching element is large when turning off the switching element, a problem of switching noise occurs. In order to reduce the problem of such switching noise, the drive circuit is demanded to have a function of gradually lowering the gate voltage at the time of switching off.

It is desired to provide the drive circuit simultaneously with the function of preventing the switching element from being destroyed by the surge voltage, the function of preventing the switching element from being falsely turned off, and the function of reducing the problem of the switching noise. If the drive circuit is provided with all of these functions, however, a problem of an increased chip size and an increased cost is caused.

SUMMARY OF THE INVENTION

According to an aspect of the present invention, there is provided with a gate drive circuit comprising: a first switching element connected at one end to a power terminal; a second switching element connected at one end to the other end of the first switching element and connected at the other end to a reference terminal; a gate voltage output terminal which supplies a voltage relating to a voltage at a node between the first switching element and the second switching element to a drive switching element as an output gate voltage; a gate voltage monitoring circuit which monitors the output gate voltage, and generates a gate voltage monitoring signal for indicating whether the output gate voltage is higher than a threshold voltage of the drive switching element; an overcurrent detection circuit which monitors a current through the drive switching element and generates an overcurrent monitoring signal for indicating whether an overcurrent is flowing through the drive switching element; and a control circuit which generates a control voltage for controlling impedance of the second switching element on the basis of an on/off signal for indicating that the drive switching element should be turned on/off, the gate voltage monitoring signal and the overcurrent monitoring signal, and supplies the generated control voltage to the second switching element.

According to an aspect of the present invention, there is provided with a semiconductor module comprising: a high-side drive switching element connected at one end to a first power terminal and connected at the other end to an output terminal to which a load can be connected; a low-side drive switching element connected at one end to the output terminal and connected at the other end to a first reference terminal; and a gate drive circuit which controls on/off of the low-side drive switching element, the gate drive circuit including: a first switching element connected at one end to a second power terminal; a second switching element connected at one end to the other end of the first switching element and connected at the other end to a second reference terminal; a gate voltage output terminal which supplies a voltage relating to a voltage at a node between the first switching element and the second switching element to the low-side drive switching element as an output gate voltage; a gate voltage monitoring circuit which monitors the output gate voltage, and generates a gate voltage monitoring signal for indicating whether the output gate voltage is higher than a threshold voltage of the low-side drive switching element; an overcurrent detection circuit which monitors a current through the low-side drive switching element and generates an overcurrent monitoring signal for indicating whether an overcurrent is flowing through the low-side drive switching element; and a control circuit which generates a control voltage for controlling impedance of the second switching element on the basis of an on/off signal for indicating that the low-side drive switching element should be turned on/off, the gate voltage monitoring signal and the overcurrent monitoring signal, and supplies the generated control voltage to the second switching element.

According to an aspect of the present invention, there is provided with a method for driving a switching element, comprising: detecting a voltage relating to a voltage at a node between a first switching element and a second switching element as an output gate voltage, the output gate voltage being to be supplied with a drive switching element to be driven, the first switching element being connected at one end to a power terminal, the second switching element being connected at one end to the other end of the first switching element and connected at the other end to a reference terminal; monitoring whether the output gate voltage is or not higher than a threshold voltage of the drive switching element; monitoring whether an overcurrent is or not flowing through the drive switching element; and controlling impedance of the second switching element on the basis of an on/off signal for indicating that the drive switching element should be turned on/off, a monitoring result of the output gate voltage and a monitoring result of the overcurrent.

DETAILED DESCRIPTION OF THE INVENTION

Figure 1:
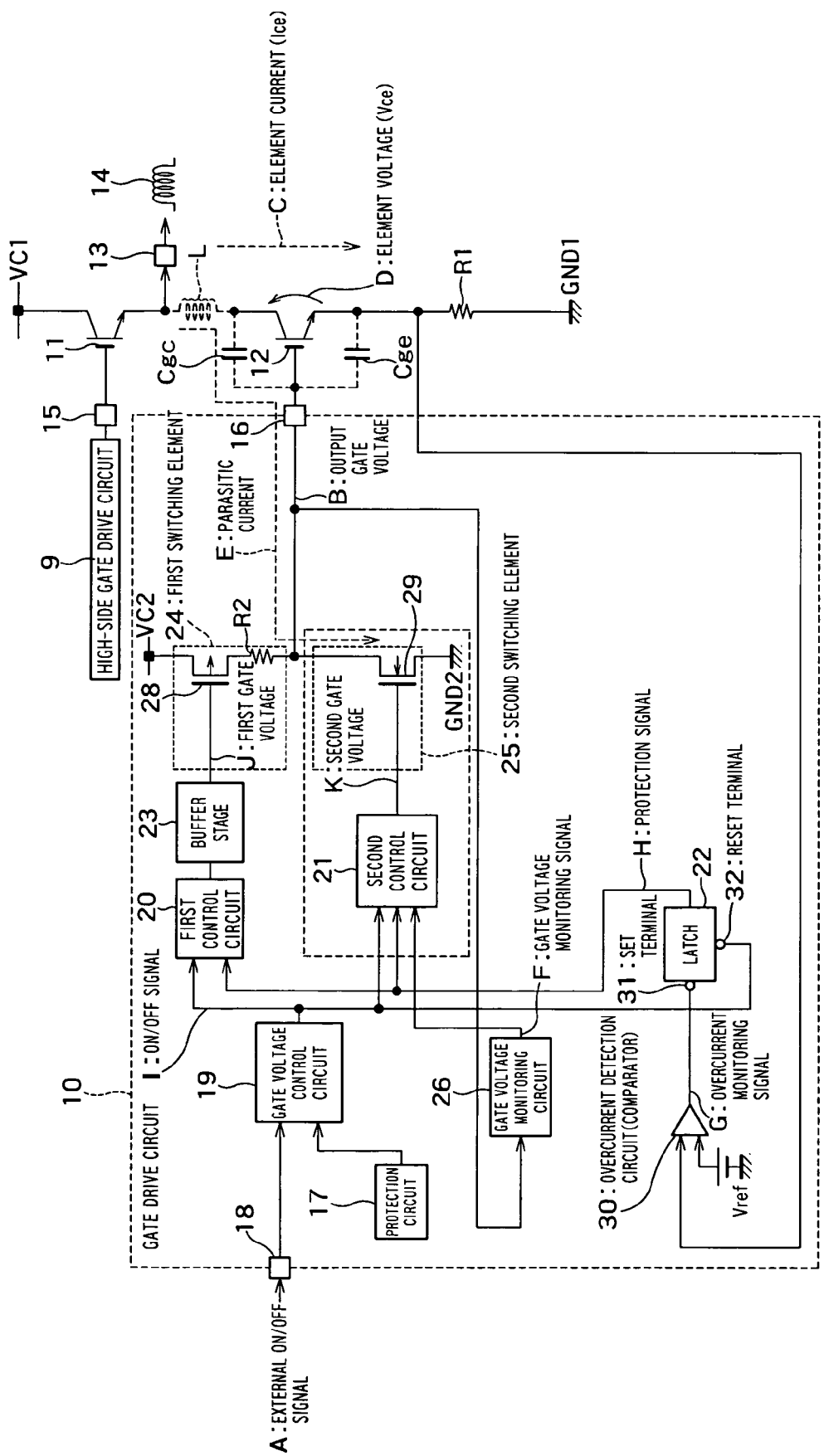
FIG. 1 is a block diagram showing a semiconductor module including a gate drive circuit according to an embodiment.

FIG. 1 is a block diagram showing a semiconductor module including a gate drive circuit according to an embodiment of the present invention.

Switching elements 11 and 12 are connected in series between a power terminal VC1 and a ground terminal GND1. The switching elements 11 and 12 are, for example, IGBTs. The IGBTs 11 and 12 form a half bridge. The IGBT 11 is connected at its collector to the power terminal VC1, and connected at its emitter to the collector of IGBT 12. The IGBT 12 is connected at its emitter to one end of an impedance circuit R1 such as a resistor. The other end of the impedance circuit R1 is connected to the ground terminal GND1.

An output terminal 13 is connected to a node between the IGBTs 11 and 12. A load 14 such as a motor is connected to the output terminal 13.

A high-side gate drive circuit 9 is connected to the IGBT 11 at its gate. A low-side gate drive circuit 10 is connected to the gate of the IGBT 12. The high-side gate drive circuit is connected at its output terminal 15 to the gate of the IGBT 11. The low-side gate drive circuit 10 is connected at its output terminal 16 to the gate of the IGBT 12.

These gate drive circuits control on/off of the IGBTs 11 and 12, respectively. As a result, the voltage at the output terminal 13 is changed, and the load 14 connected to the output terminal 13 is driven.

Hereafter, the low-side gate drive circuit 10 will be described in detail.

An external on/off signal A from an external control system (not illustrated) is input to an input terminal 18 of the gate drive circuit 10 to instruct the gate drive circuit 10 to turn on/off the IGBT 12. When instructing turn-on, the external on/off signal A is at a high level. When instructing turn-off, the external on/off signal A is at a low level.

The external on/off signal A input to the input terminal 18 is input to a gate voltage control circuit 19. The gate voltage control circuit 19 outputs the external on/off signal A input from the input terminal 18 as an on/off signal, for example, as it is.

A protection circuit 17 is connected to the gate voltage control circuit 19 to prevent circuit destruction caused by a drop in voltage supplied to the gate drive circuit 10 or overheating in the drive circuit 10. Upon detecting a circuit abnormality such as the voltage drop or overheating, the protection circuit 17 outputs an operation stop signal to the gate voltage control circuit 19. Upon receiving the operation stop signal from the protection circuit 17, the gate voltage control circuit 19 outputs an off signal (low level) as the on/off signal I regardless of the external on/off signal A input from the input terminal 18.

The on/off signal I output from the gate voltage control circuit 19 is input to a first control circuit 20, a second control circuit 21, and a reset terminal 32 of a latch 22.

The first control circuit 20 inverts the on/off signal I input from the gate voltage control circuit 19, and outputs the inverted signal. In other words, when a high level is input, the first control circuit 20 outputs a low level. When a low level is input, the first control circuit 20 outputs a high level. When a high level protection signal H from the latch 22 is input to the first control circuit 20, the circuit 20 outputs a high level regardless of the on/off signal I. A signal output from the first control circuit 20 is supplied to a gate of a PMOS transistor 28 in a first switching element 24 via a buffer stage 23 as a first gate voltage J.

The second control circuit 21 generates a second gate voltage K on the basis of the on/off signal I input from the gate voltage control circuit 19, and supplies a second gate voltage K to a gate of an NMOS transistor 29 in a second switching element 25. The second control circuit 21 generates one of voltages in four stages (level 0 to level 3) as a second gate voltage K according to the on/off signal I input from the gate voltage control circuit 19, a gate voltage monitoring signal F input from a gate voltage monitoring circuit 26 described later and the protection signal H input from the latch 22. The level 0 is a low level. The level 3 is a high level. The levels 1 and 2 are intermediate voltages located between the low level and the high level. The voltage becomes higher in the order of the levels 0, 1, 2 and 3. A voltage of a level in the levels of the four stages is selectively input to the gate of the NMOS transistor 29, thereby impedance of the NMOS transistor 29 is controlled. In other words, the NMOS transistor 29 functions as a variable impedance element, and the second control circuit 21 functions as a impedance control circuit. Impedance set by the second gate voltage K at the level 0 is the highest. Impedance set by the second gate voltage K at the level 3 is the lowest. The impedance set in the NMOS transistor 29 becomes lower in the order of the level 0, 1, 2 and 3.

The first switching element 24 and the second switching element 25 are connected in series between a power terminal VC2 and a ground terminal GND2.

The first switching element 24 includes a PMOS transistor 28 and an impedance circuit R2 connected in series. The impedance circuit R2 is, for example, a resistor. A source side of the PMOS transistor 28 is connected to the power terminal VC2, and a drain side of the PMOS transistor 28 is connected to one end of the impedance circuit R2.

The second switching element 25 includes an NMOS transistor 29. A source side of the NMOS transistor 29 is connected to the ground terminal GND2, and a drain side of the NMOS transistor 29 is connected to the other end of the impedance circuit R2 in the first switching element 24.

By controlling on/off of the first switching element 24 and the second switching element 25, on/off of the IGBT 12 is controlled.

Specifically, if the first switching element 24 turns on and the second switching element 25 turns off (level 0), an output gate voltage B having the high level is generated at a node between the impedance circuit R2 and the NMOS transistor 29. The generated output gate voltage B is output from the output terminal 16 and input to the gate of the IGBT 12 to turn on the IGBT 12.

On the other hand, if the first switching element 24 turns off and the second switching element 25 turns on (level 3), the output gate voltage B having the low level is generated at the node. As described in detail later, however, the second switching element 25 is controlled to reach the level 3 via the level 1 or 2. The generated output gate voltage B having the low level is input to the gate of the IGBT 12 via the output terminal 16, and the IGBT 12 turns off.

An output voltage at the output terminal 13 connected to the emitter of the IGBT 11 and the collector of the IGBT 12 is determined by on/off of the IGBTs 11 and 12, and supplied to the load 14.

The gate voltage monitoring circuit 26 is connected to the node between the first switching element 24 and the second switching element 25 to monitor the output gate voltage B and detect whether the output gate voltage B is higher than a threshold of the IGBT 12. The output gate voltage B from the node is input to the gate voltage monitoring circuit 26. The gate voltage monitoring circuit 26 detects whether the output gate voltage B is higher than the threshold of the IGBT 12, and outputs a result of the detection as the gate voltage monitoring signal F.

Specifically, the gate voltage monitoring circuit 26 outputs a low level signal as the gate voltage monitoring signal F when the output gate voltage B is higher than the threshold, whereas the gate voltage monitoring circuit 26 outputs a high level signal as the gate voltage monitoring signal F when the output gate voltage B is lower than or equal to the threshold. The output gate voltage monitoring signal F is input to the second control circuit 21. In other words, the output of the gate voltage monitoring circuit 26 is connected to an input of the second control circuit 21.

An overcurrent detection circuit 30 is connected to a node between the emitter of the IGBT 12 and the impedance circuit R1 to detect an overcurrent. In the present embodiment, the overcurrent detection circuit 30 is, for example, a comparator. The overcurrent detection circuit 30 is supplied with a voltage at the node between the emitter of the IGBT 12 and the impedance circuit R1 and a reference voltage Vref. By comparing these voltages with each other, the overcurrent detection circuit 30 detects whether an overcurrent is flowing through the IGBT 12. The overcurrent detection circuit 30 outputs a result of the detection as an overcurrent monitoring signal G.

Specifically, the overcurrent detection circuit 30 outputs a high level signal as the overcurrent monitoring signal G when it has detected that an overcurrent is flowing through the IGBT 12, whereas the overcurrent detection circuit 30 outputs a low level signal as the overcurrent monitoring signal G when it has detected that an overcurrent is not flowing through the IGBT 12. The overcurrent monitoring signal G output from the overcurrent detection circuit 30 is input to a set terminal 31 in the latch 22.

When the high level overcurrent monitoring signal G indicating the overcurrent is input to the latch 22, the latch 22 outputs the high level protection signal H (protection start signal) and retains the output. If in this state the off signal (the low level on/off signal I) from the gate voltage control circuit 19 is input to the reset terminal 32, the latch 22 switches its output from the high level to a low level signal (protection cancel signal). Thereafter, the latch 22 retains the low level protection signal H until the high level overcurrent monitoring signal G from the overcurrent detection circuit 30 is input thereto. The protection signal H output from the latch 22 is input to the first control circuit 20 and the second control circuit 21. In other words, the output of the latch 22 is connected to inputs of the first control circuit 20 and the second control circuit 21.

Figure 2:
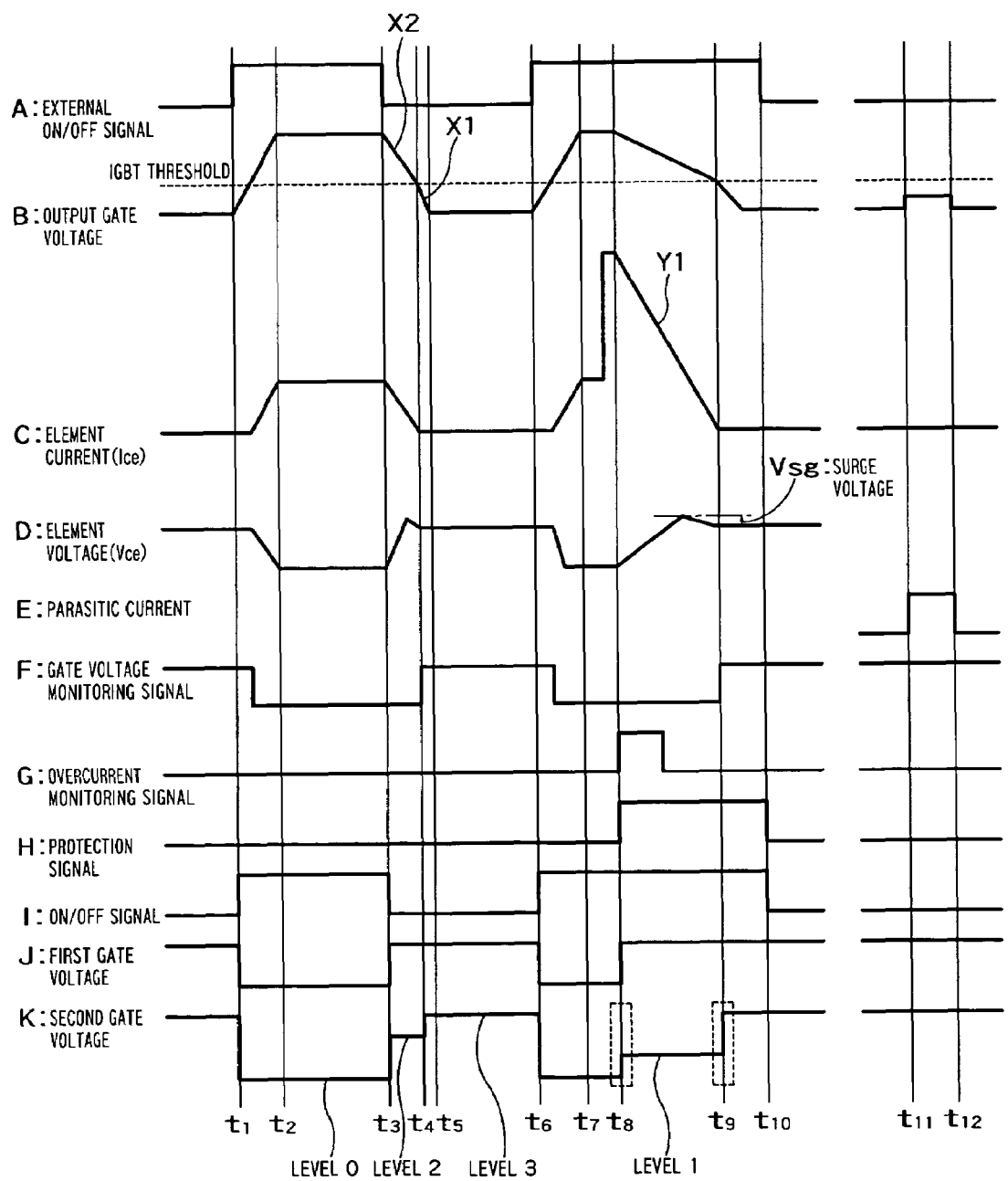
FIG. 2 is a timing chart showing operation of the gate drive circuit shown in FIG. 1.

FIG. 2 is a timing chart showing an operation example of the gate drive circuit 10 shown in FIG. 1.

Specifically, FIG. 2 shows changes with the lapse of time of the following items.

A: External on/off signal
B: Output gate voltage
C: Element current (Ice) flowing between the collector and the emitter of the IGBT 12
D: Element voltage (Vce) between the collector and the emitter of the IGBT 12
E: Parasitic current flowing to the second switching element 25 via parasitic capacitance Cgc formed between the emitter and the gate of the IGBT 12
F: Gate voltage monitoring signal
G: Overcurrent monitoring signal
H: Protection signal
I: On/off signal
J: First gate voltage
K: Second gate voltage (1) On operation of IGBT 12

At time t1, the high level external on/off signal A from the external control system is input to the gate voltage control circuit 19 via the input terminal 18. The gate voltage control circuit 19 outputs the high level on/off signal I on the basis of the input high level external on/off signal A. The high level on/off signal I output from the gate voltage control circuit 19 is input to the first control circuit 20, the second control circuit 21, and the reset terminal 32 of the latch 22.

The first control circuit 20 inverts the high level on/off signal I input from the gate voltage control circuit 19 to a low level and outputs the low level signal. The output low level signal is input to the gate of the PMOS transistor 28 in the first switching element 24 as the first gate voltage J via the buffer stage 23. As a result, the PMOS transistor 28 turns on.

On the other hand, the second control circuit 21 generates the low level (the level 0) voltage (a second control voltage) as the second gate voltage K on the basis of the high level on/off signal I input from the gate voltage control circuit 19. The low level second gate voltage K thus generated is input to the gate of the NMOS transistor 29 in the second switching element 25. As a result, the NMOS transistor 29 turns off.

When the first switching element 24 turns on and second switching element 25 turns off as heretofore described (the highest impedance (a second impedance) among four stages of impedance is set), the output gate voltage B is gently raised by the action of the resistor R2 with time t1 being set as a starting point. The raised output gate voltage B becomes a constant level at time t2.

By the way, the high level on/off signal I is input to the reset terminal 32 of the latch 22 as described above, and the latch 22 maintains the low level protection signal H as its output.

(2-1) Off Operation of IGBT 12 (Until Before the Output Gate Voltage B Falls to the Threshold of IGBT 12)

At time t3, the low level external on/off signal A from the external control system is input to the gate voltage control circuit 19 via the input terminal 18. The gate voltage control circuit 19 outputs the low level on/off signal I on the basis of the input low level external on/off signal A. The low level on/off signal I output from the gate voltage control circuit 19 is input to the first control circuit 20, the second control circuit 21, and the reset terminal 32 of the latch 22.

The first control circuit 20 inverts the low level on/off signal I input from the gate voltage control circuit 19 to a high level and outputs the high level. The output high level signal is input to the gate of the PMOS transistor 28 in the first switching element 24 as the first gate voltage J via the buffer stage 23. As a result, the first switching element 24 turns off.

On the other hand, the second control circuit 21 generates the gate voltage of the level 2 among the levels 0 to 3 (a third control voltage) as the second gate voltage K on the basis of the low level on/off signal I input from the gate voltage control circuit 19. In other words, the second control circuit 21 generates the voltage of the level 2, if the low level on/off signal I is input in the case of the low level protection signal H (there isn't an overcurrent) and the low level gate voltage monitoring signal F (the gate voltage is higher than the threshold). The gate voltage of the level 2 thus generated is input to the gate of the NMOS transistor 29 in the second switching element 25. As a result, the impedance of the NMOS transistor 29 is set equal to the second lowest level (a third impedance) among the impedances of four stages described above.

After the low level external on/off signal A is input at the time t3, therefore, the output gate voltage B is properly lowered while maintaining the low noise, low loss and high transfer efficiency.

In other words, if the impedance of the NMOS transistor 29 is too low, the output gate voltage B abruptly falls, resulting in large noise and a large loss. On the other hand, if the impedance of the NMOS transistor 29 is too high, the time required since the low level external on/off signal A is input until the IGBT 12 turns off becomes long, resulting in worsened transfer characteristics. In the present embodiment, the impedance of the NMOS transistor 29 is controlled to become a proper value, and it is possible to reduce the noise, loss and transfer time.

(2-2) Off Operation of IGBT 12 (After Gate Boltage of IGBT 12 has Fallen to Threshold or Lower)

From the time t3, the output gate voltage B gradually falls. At time t4, the output gate voltage B becomes equal to the threshold of the IGBT 12. If the output gate voltage B becomes equal to or lower than the threshold of the IGBT 12, the gate voltage monitoring circuit 26 outputs the high level gate voltage monitoring signal F indicating that the output gate voltage B is equal to or lower than the threshold, and the high level gate voltage monitoring signal F is input to the second control circuit 21. If the high level gate voltage monitoring signal F is input, the second control circuit 21 switches its output voltage from the voltage of the level 2 (the third control voltage) to the voltage of the level 3 (the high level) (a first control voltage). In other words, the second control circuit 21 generates the second gate voltage K of the level 3 (the high level).

The second gate voltage K of the level 3 (the high level) generated by the second control circuit 21 is input to the gate of the NMOS transistor 29 in the second switching element 25. As a result, the impedance of the NMOS transistor 29 is set equal to the lowest level (a first impedance) among the impedances of the four stages described above (i.e., the NMOS transistor 29 turns on). As a result, the output gate voltage B falls more rapidly than that before arriving at the threshold of the IGBT 12 (during the time between t3 and t4). In other words, a magnitude X1 of a slope of the output gate voltage B during the time between t4 and t5 is greater than a magnitude X2 of the slope of the output gate voltage B during the time between t3 and t4. The output gate voltage B which has thus fallen rapidly becomes the low level at time t5.

As heretofore described, the impedance of the NMOS transistor 29 is set to the lowest level when the output gate voltage B has fallen to the threshold. Even if a parasitic current E flows via parasitic inductance L and parasitic capacitance Cgc due to a potential rise at the output terminal 13 at the time of the off-state, therefore, the rise of the gate potential can be suppressed to a sufficiently low value (suppressed to a value lower than the threshold). Accordingly, the probability of false turn-on of the IGBT 12 is reduced to a low value as far as possible. An interval between t11 and t12 in FIG. 2 indicates the case where the parasitic current E occurs in an interval corresponding to the interval between t4 and t5 (an interval over which the output gate voltage B is equal to or lower than the threshold), but the rise of the output gate voltage B is suppressed to be lower than the threshold.

(3) Off Operation of the IGBT 12 Based on Overcurrent Detection

First, ordinary on-operation is started at time t6. In other words, the high level external on/off signal A is input to the gate voltage control circuit 19 via the input terminal 18. The high level on/off signal I is output from the gate voltage control circuit 19 on the basis of the high level external on/off signal A. The high level on/off signal I is input to the first control circuit 20, and a low level signal is output from the first control circuit 20 on the basis of the high level on/off signal I. This low level signal is input to the gate of the PMOS transistor 28 in the first switching element 24 via the buffer stage 23 as the low level first gate voltage J (on-signal).

On the other hand, the high level external on/off signal A output from the gate voltage control circuit 19 is input to the second control circuit 21. The low level (the 0 level) second gate voltage K (off signal) is output from the second control circuit 21 on the basis of the high level external on/off signal A. The low level (the 0 level) second gate voltage K (off signal) is input to the gate of the NMOS transistor 29 in the second switching element 25.

As a result of the operation heretofore described, the first switching element 24 turns on, and the second switching element 25 turns off. As a result, the output gate voltage B is gently raised by the action of the resistor R2 with time t6 being set as a starting point. The raised output gate voltage B becomes a constant level at time t7.

It is now supposed that an overcurrent such as a penetrating current flows through the IGBT 12 after the time t7 due to occurrence of an abnormality such as turn-on of the high-side IGBT 11 or a rise in voltage at the output terminal 13 (see an element current C in the interval between t7 and t8).

The fact that the overcurrent has flown through the IGBT 12 is detected by the overcurrent detection circuit 30 at time t8, and a high level overcurrent monitoring signal G is output from the overcurrent detection circuit 30.

The high level overcurrent monitoring signal G output from the overcurrent detection circuit 30 is input to the set terminal 31 of the latch 22, and the high level protection signal H is output from the latch 22.

The high level protection signal H output from the latch 22 is input to the first control circuit 20 and the second control circuit 21.

When the high level protection signal H is input, the first control circuit 20 outputs a high level signal (off signal) regardless of the input of the high level on/off signal I. The high level signal (off signal) is input to the gate of the PMOS transistor 28 in the first switching element 24 as the first gate voltage J via the buffer stage 23. As a result, the first switching element 24 is turned off.

On the other hand, when the high level protection signal H from the latch 22 is input, the second control circuit 21 switches its output voltage from the voltage of the level 0 to the voltage of the level 1 (a fourth control voltage). In other words, the second control circuit 21 generates the second gate voltage K of the level 1.

The second gate voltage K of the level 1 generated by the second control circuit 21 is input to the gate of the NMOS transistor 29 in the second switching element 25. As a result, the impedance of the NMOS transistor 29 is set equal to the third lowest level (a fourth impedance) among the impedances of four stages described above.

As heretofore described, the first switching element 24 is turned off, and the impedance of the NMOS transistor 29 is set equal to the third lowest level. After the overcurrent is detected at time t8, the element current C in the IGBT 12 gently decreases. In other words, a value Y1 of di/dt is suppressed to a low value. As a result, a surge voltage Vsg generated in the IGBT 12 by di/dt is suppressed to a low value as far as possible (see an element voltage D in an interval between t8 and t9).

In other words, as shown in FIG. 1, parasitic inductance L is present between the node between the IGBTs 11 and 12 and the collector of the IGBT 12. For example, if the second switching element 25 is turned on (the impedance is the lowest) in a state in which the current is greater than that in the ordinary on-state, the current change di/dt becomes large. Therefore, a large surge voltage is generated on the IGBT 12 by the action of the inductance L. In the present embodiment, the impedance of the NMOS transistor 29 is set equal to a proper value (the third lowest level), and consequently the change of the element current C can be made gentle. As a result, the surge voltage is made low as far as possible, and the IGBT is prevented from being destroyed. From the viewpoint of surge voltage reduction, it is desirable to make the impedance of the NMOS transistor 29 larger than the above-described value. If the impedance is too large, however, for example, falling of the output gate voltage B becomes too late and a problem of worsened transfer characteristics might occur. In the present embodiment, therefore, the impedance of the NMOS transistor 29 is set equal to the third lowest level in order to decrease the surge voltage and prevent the falling of the output gate voltage B from being delayed.

Subsequently, if the output gate voltage B becomes equal to or lower than the threshold at time t9, the high level gate voltage monitoring signal F is output from the gate voltage monitoring circuit 26 and the high level gate voltage monitoring signal F is input to the second control circuit 21. When the high level gate voltage monitoring signal F is input, the second control circuit 21 switches its output voltage from the voltage of the level 1 to the voltage of the level 3 (the first control voltage). In other words, the second control circuit 21 generates the second gate voltage K of the level 3. The second gate voltage K of the level 3 from the second control circuit 21 is input to the gate of the NMOS transistor 29 in the second switching element 25. As a result, the NMOS transistor 29 turns on. In other words, the NMOS transistor 29 is set equal to the lowest level (the first impedance) among the impedances of the four stages described above. As a result, the output gate voltage B falls rapidly.

Thereafter, at time t10, the low level external on/off signal A from the external control system is input to the gate voltage control circuit 19 via the input terminal 18. The low level on/off signal I is output from the gate voltage control circuit 19 on the basis of the low level external on/off signal A. The low level on/off signal I output from the gate voltage control circuit 19 is input to the reset terminal 32 of the latch 22. The latch 22 switches its output, i.e., the protection signal H from the high level to the low level, and retains the low level.

Hereafter, three configurations will be described as concrete example of the second control circuit 21.

Figure 3:
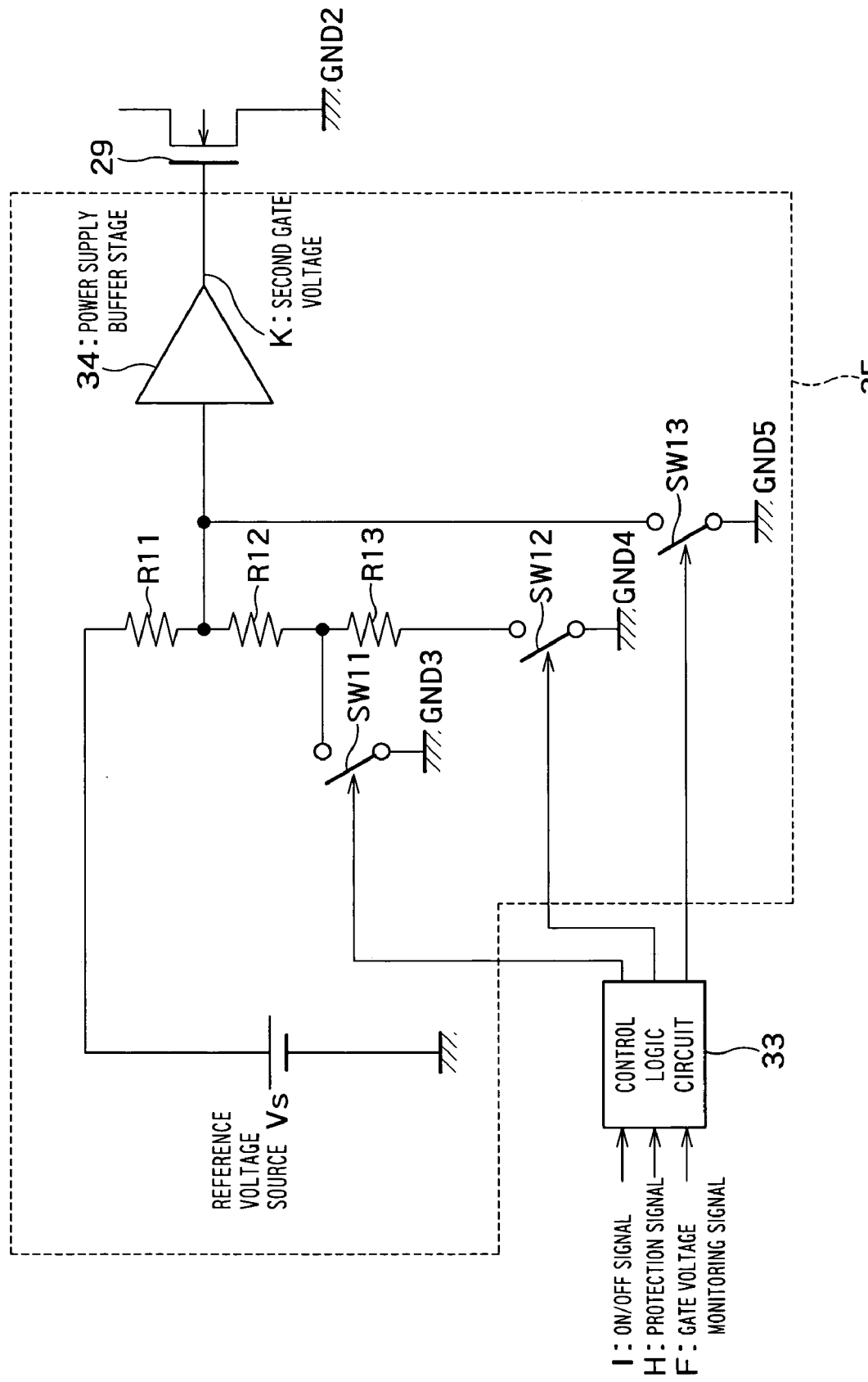
FIG. 3 is a block diagram schematically showing a concrete example of a second control circuit.

FIG. 3 is a block diagram schematically showing a concrete example of the second control circuit 21.

This concrete example includes a control logic circuit 33 and a power supply circuit 35.

The power supply circuit 35 includes a reference voltage source Vs, impedances R11 to R13, switches SW11 to SW13, a power supply buffer stage 34, and ground terminals GND3 to GND5.

In the power supply circuit 35, the impedances R11 to R13 are connected in series to the reference voltage source Vs.

A switch SW11 is connected between a node between one end of the impedance R13 and one end of the impedance R12 and the ground terminal GND3.

A switch SW12 is connected between the other end of the impedance R13 and the ground terminal GND4.

Furthermore, a switch SW13 is connected between a node between the impedance R12 and the impedance R11 and the ground terminal GND5. The power supply buffer stage 34 is connected to the node in parallel to the switch SW13. An output of the power supply buffer stage 34 is connected to the gate of the NMOS transistor 29.

The control logic circuit 33 is connected to the switches SW11 to SW13 to control on/off of the switches SW11 to SW13.

The on/off signal I, the protection signal H and the gate voltage monitoring signal F are input to the control logic circuit 33. The control logic circuit 33 controls on/off of the switches SW11 to SW13 on the basis of these input signals, and thereby generates second gate voltage K having four possible levels 0 to 3.

Specifically, when the switches SW11 and SW12 are off and the switch SW13 is on, the second gate voltage K of the level 0 (low level) is generated.

When the switch SW11 is on and the switches SW12 and SW13 are off, the second gate voltage K of the level 1 is generated.

When the switches SW11 and SW13 are off and the switch SW12 is on, the second gate voltage K of the level 2 is generated.

When all of the switches SW11 to SW13 are off, the second gate voltage K of the level 3 (high level) is generated.

As heretofore described, the second gate voltages K of the levels 0 to 3 can be generated by properly dividing the voltage generated by the reference voltage source Vs using the switches SW11 to SW13 and the impedances R11 to R13.

Figure 4:
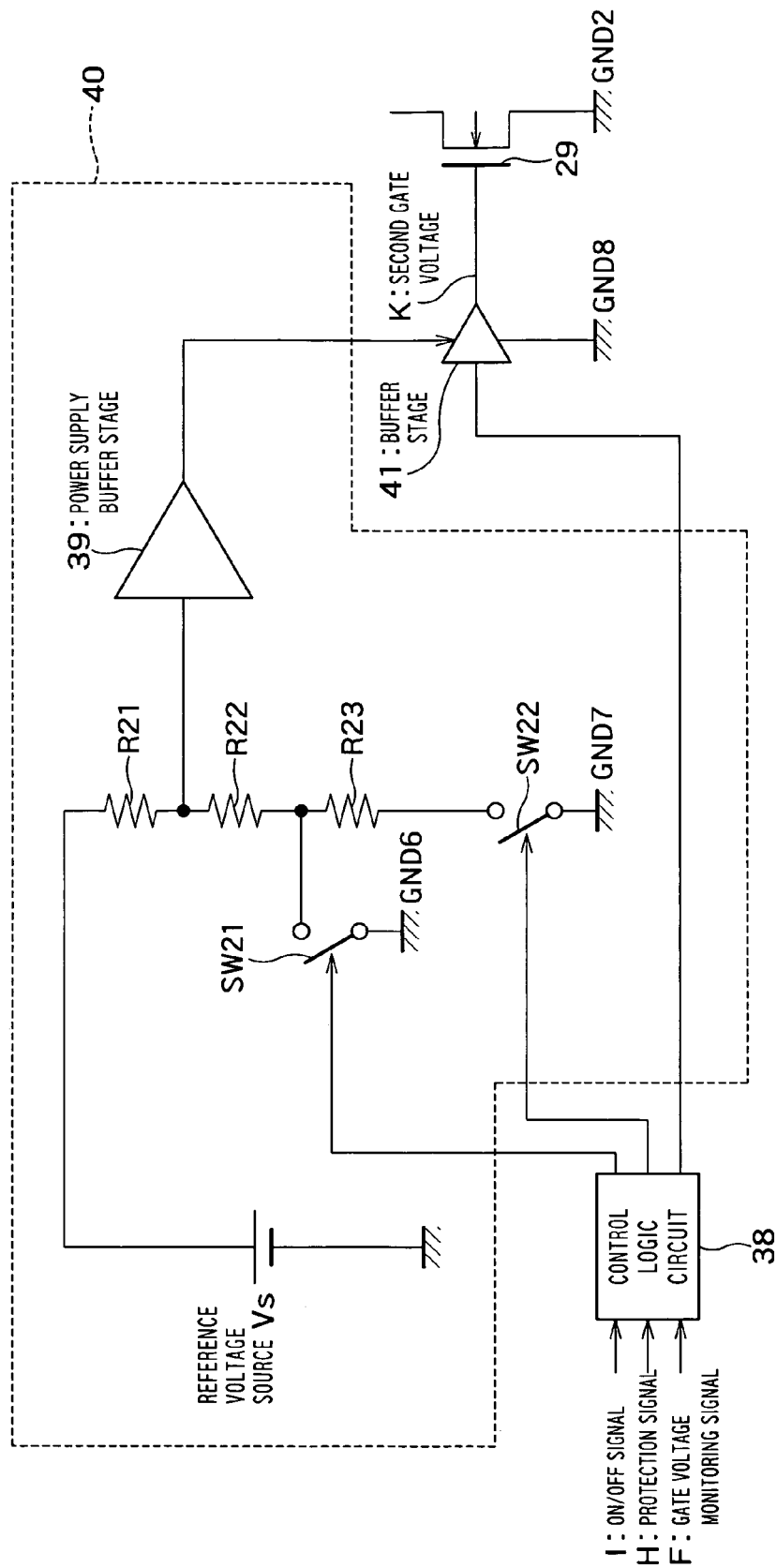
FIG. 4 is a block diagram schematically showing a further concrete example of the second control circuit.

FIG. 4 is a block diagram schematically showing a further concrete example of the second control circuit 21.

This further concrete example includes a control logic circuit 38, a power supply circuit 40, a buffer stage 41, and a ground terminal GND8.

In the power supply circuit 40, impedances R21 to R23 are connected in series to a reference voltage source Vs.

A switch SW21 is connected between a node between one end of the impedance R22 and one end of the impedance R23 and a ground terminal GND6.

A switch SW22 is connected between the other end of the impedance R23 and a ground terminal GND7.

Furthermore, a power supply buffer stage 39 is connected to a node between the impedance R22 and the impedance R21. An output voltage of the power supply buffer stage 39 is supplied to the buffer stage 41 as its operation voltage.

The control logic circuit 38 is connected to the switches SW21 and SW22 to control on/off of the switches SW21 and SW22.

The on/off signal I, the protection signal H and the gate voltage monitoring signal F are input to the control logic circuit 38. The control logic circuit 38 controls on/off of the switches SW21 and SW22 on the basis of these signals, and thereby supplies an operation voltage having three possible levels to the buffer stage 41. On the other hand, the control logic circuit 38 generates a high level signal or a low level signal on the basis of the above-described signals, and supplies the generated signal to an input of the buffer stage 41.

Figure 5:
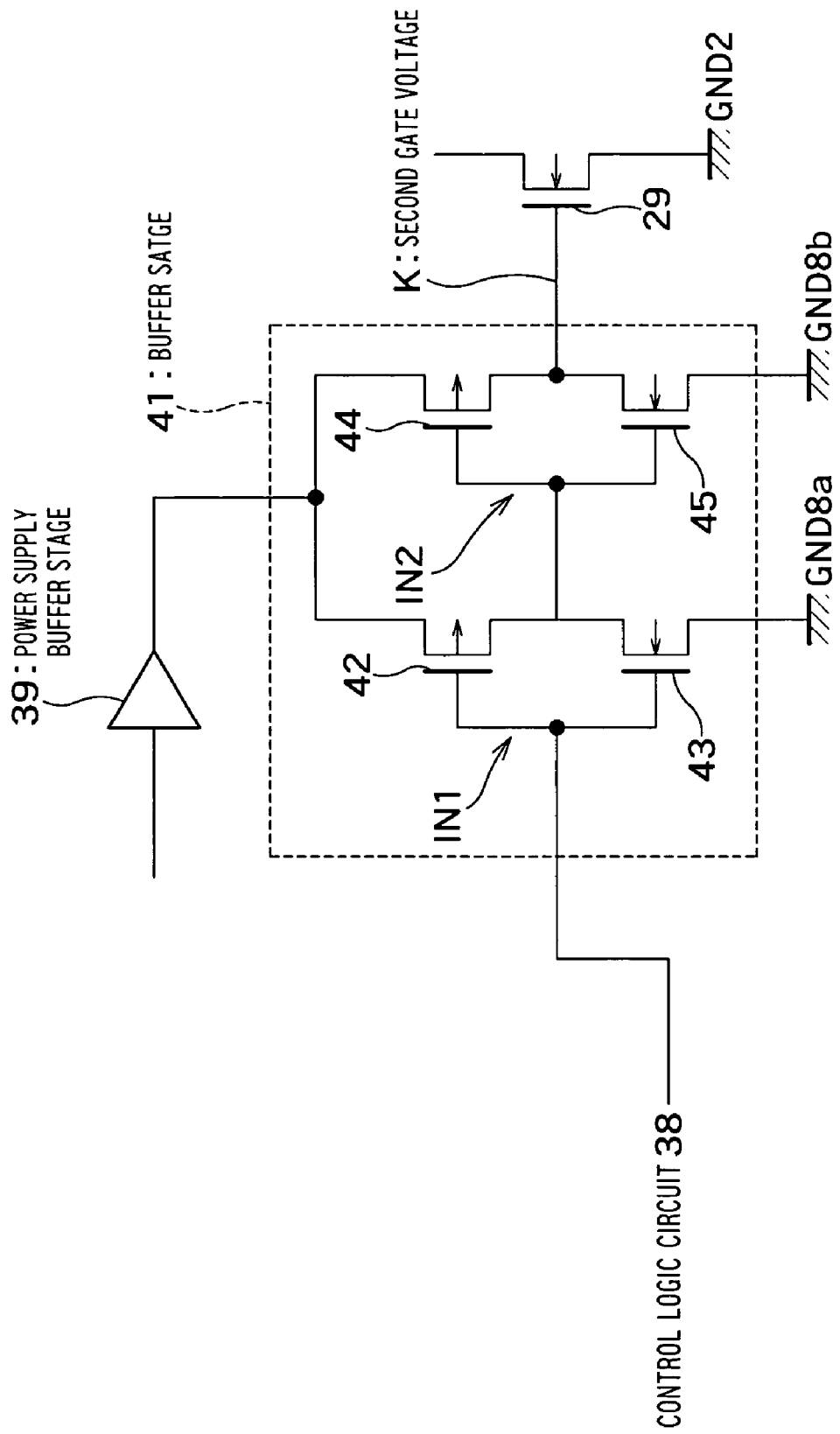
FIG. 5 is a block diagram showing a buffer in the further concrete example.

FIG. 5 is a block diagram showing the buffer stage 41 in detail.

The buffer stage 41 includes two inverters IN1 and IN2 connected in series. In other words, the buffer stage 41 is formed as a logic circuit.

An output of the control logic circuit 38 is connected to gates of a PMOS transistor 42 and an NMOS transistor 43 in common in the inverter IN1. Drains of the PMOS transistor 42 and the NMOS transistor 43 are connected to each other. The PMOS transistor 42 is connected at its source to an output of the power supply buffer stage 39. The NMOS transistor 43 is connected at its source to a ground terminal GND8a.

An output of the inverter IN1 is connected to gates of a PMOS transistor 44 and an NMOS transistor 45 in common in the inverter IN2. Drains of the PMOS transistor 44 and the NMOS transistor 45 are connected to each other. The PMOS transistor 44 is connected at its source to an output of the power supply buffer stage 39. The NMOS transistor 45 is connected at its source to a ground terminal GND8b.

An output of the inverter IN2 is connected to the gate of the NMOS transistor 29.

If the switches SW21 and SW22 shown in FIG. 4 are off, the highest power supply voltage among the power supply voltages of three stages is output from the power supply buffer 39 and supplied to the buffer stage 41. If in this state the high level signal from the control logic circuit 38 is input to the buffer stage 41, the second gate voltage K of the level 3 (the high level) is output from the buffer stage 41. On the other hand, if in this state the low level from the control logic circuit 38 is input to the buffer stage 41, the second gate voltage K of the level 0 (the low level) is output from the buffer stage 41.

If the switch SW21 is off and the switch SW22 is on, the second highest power supply voltage among power supply voltages of three stages is output from the power supply buffer 39, and supplied to the buffer stage 41. If in this state the high level from the control logic circuit 38 is input to the buffer stage 41, the second gate voltage K of the level 2 is output from the buffer stage 41.

If the switch SW21 is on and the switch SW22 is off, the lowest power supply voltage among power supply voltages of three stages is output from the power supply buffer 39, and supplied to the buffer stage 41. If in this state the high level from the control logic circuit 38 is input to the buffer stage 41, the second gate voltage K of the level 1 is output from the buffer stage 41.

As heretofore described, the second gate voltage K of the levels 0 to 3 can be generated by connecting the buffer stage 41 (logic circuit) to the gate of the NMOS transistor 29 and controlling the operation voltage level supplied to the logic circuit 41 and the input signal (on or off) of the logic circuit 41.

Figure 6:
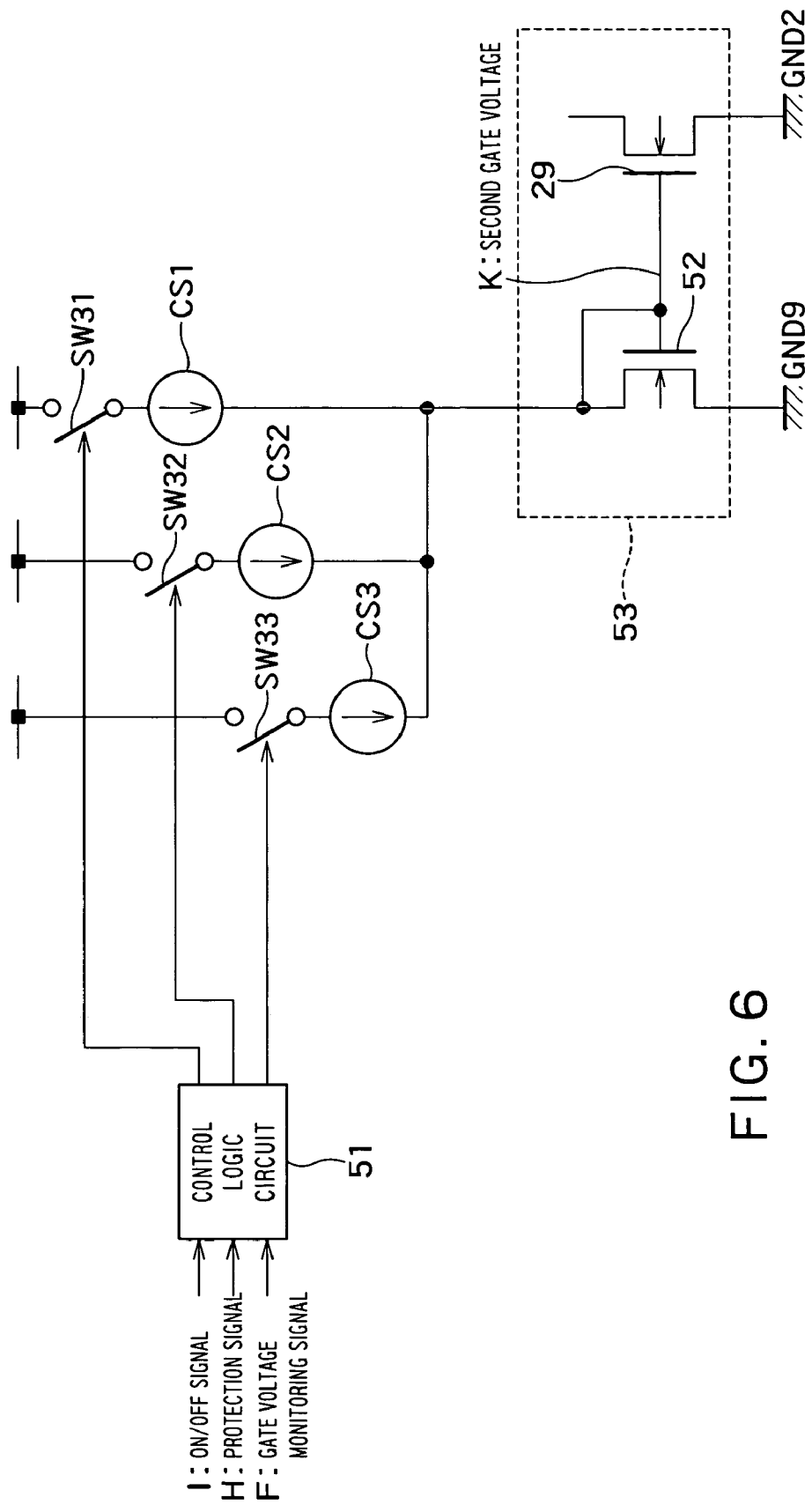
FIG. 6 is a block diagram schematically showing a further other concrete example of the second control circuit.

FIG. 6 is a block diagram showing a further other concrete example of the second control circuit 21.

An NMOS transistor 52 which forms a current mirror circuit 53 with the NMOS transistor 29 in the second switching element 25 is provided. A source side of the NMOS transistor 52 is connected to a ground terminal GND9. The gate of NMOS transistor 52 is connected to the drain of NMOS transistor 52 and the gate of NMOS transistor 29.

First to third current sources CS1 to CS3 are connected in parallel to the drain of the NMOS transistor 52 at its drain. For simplifying the description, it is now supposed that all of the first to third current sources CS1 to CS3 have the same configuration. The first to third current sources CS1 to CS3 are connected to respective power terminals via switches SW31 to SW33, respectively.

A control logic circuit 51 is connected to the switches SW31 to SW33 to control on/off of the switches SW31 to SW33.

The on/off signal I, the protection signal H and the gate voltage monitoring signal F are input to the control logic circuit 51. The control logic circuit 51 controls on/off of the switches SW31 to. SW33 on the basis of these signals. The control logic circuit 51 generates a current having one of four possible magnitudes by controlling on/off of the switches SW31 to SW33, and supplies the generated current to the NMOS transistor 52.

Specifically, if all of the switches SW31 to SW33 are on, a largest current among currents of four possible magnitudes is generated and the current flows through the NMOS transistor 52. A gate voltage of the NMOS transistor 52 corresponding to this current is input to the gate of the NMOS transistor 29 as the second gate voltage K of the level 3 (high level).

If the switches SW31 and SW32 are on and the switch SW33 is off, a second largest current among the currents of the four possible magnitudes is generated and the current flows through the NMOS transistor 52. A gate voltage of the NMOS transistor 52 corresponding to this current is input to the gate of the NMOS transistor 29 as the second gate voltage K of the level 2.

If the switches SW31 is on and the switches SW32 and SW33 are off, a third largest current among the currents of the four possible magnitudes is generated and the current flows through the NMOS transistor 52. A gate voltage of the NMOS transistor 52 corresponding to this current is input to the gate of the NMOS transistor 29 as the second gate voltage K of the level 1 if all of the switches SW31 to SW33 are off, a smallest current among the currents of the four possible magnitudes is generated. In other words, a current having a magnitude 0 is generated. As a result, the gate voltage of the NMOS transistor 52 becomes the low level (level 0). The low level is input to the gate of the NMOS transistor 29 as the second gate voltage K.

In FIG. 6, three current sources are shown. In the present embodiment, however, it suffices that currents having four possible magnitudes can be generated. Therefore, the number of current sources is not restricted to three.

As heretofore described, the second gate voltage K having the levels 0 to 3 can be generated by providing the NMOS transistor 52 which forms the current mirror with the NMOS transistor 29, controlling on/off of a plurality of current sources connected in parallel to generate the input current of the NMOS transistor 52.

According to the present embodiment, the impedance of the second switching element is controlled on the basis of output signals of the gate voltage control circuit, the gate voltage monitoring circuit, and the overcurrent detection circuit, as heretofore described. Therefore, it is possible to simultaneously implement the function of preventing the destruction of the switching elements, the function of preventing the switching element from being falsely turned on, and the function of reducing the switching noise, while keeping the chip size down.

In the present embodiment described above, overcurrent detection is conducted by detecting a voltage at one end of the impedance R1 connected in series to the emitter of the IGBT 12 as shown in FIG. 1. An alternative configuration may also be used.

Figure 7:
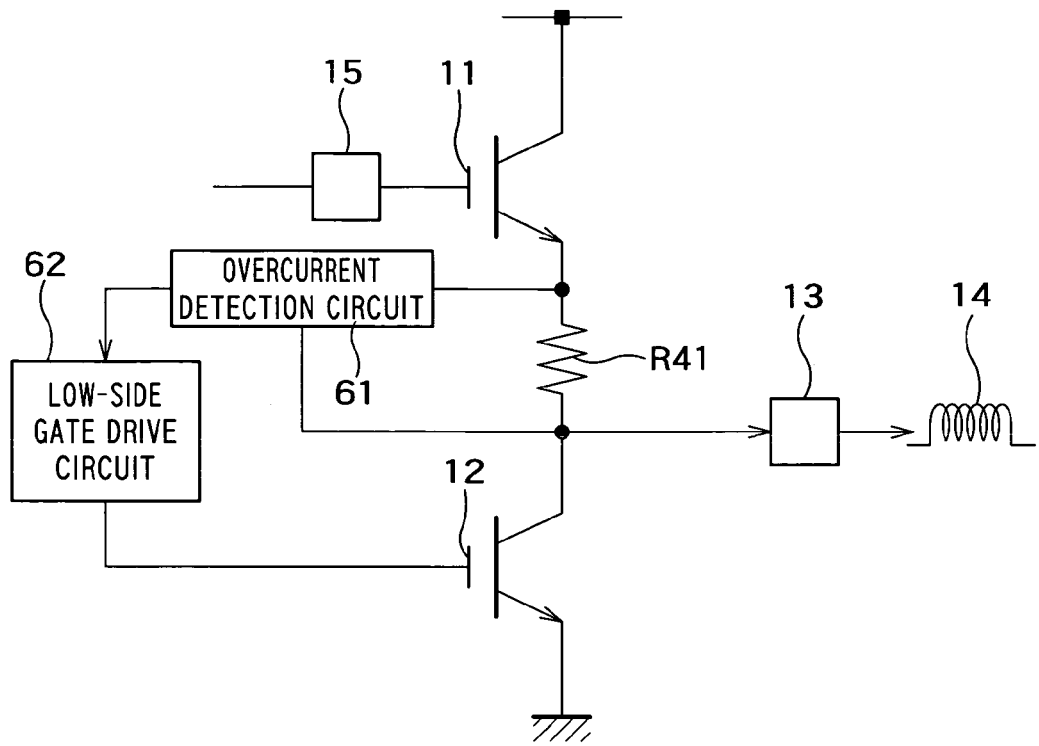
FIG. 7 is a block diagram showing another example of the semiconductor module.

For example, as shown in FIG. 7 which shows another example of the semiconductor module, it is possible to connect an impedance R41 between the output terminal 13 and the emitter of the IGBT 11 and detect a voltage across the impedance R41 by means of an overcurrent detection circuit 61 to detect an overcurrent. The overcurrent detection circuit 61 may be included in a low-side gate drive circuit 62.

Figure 8:
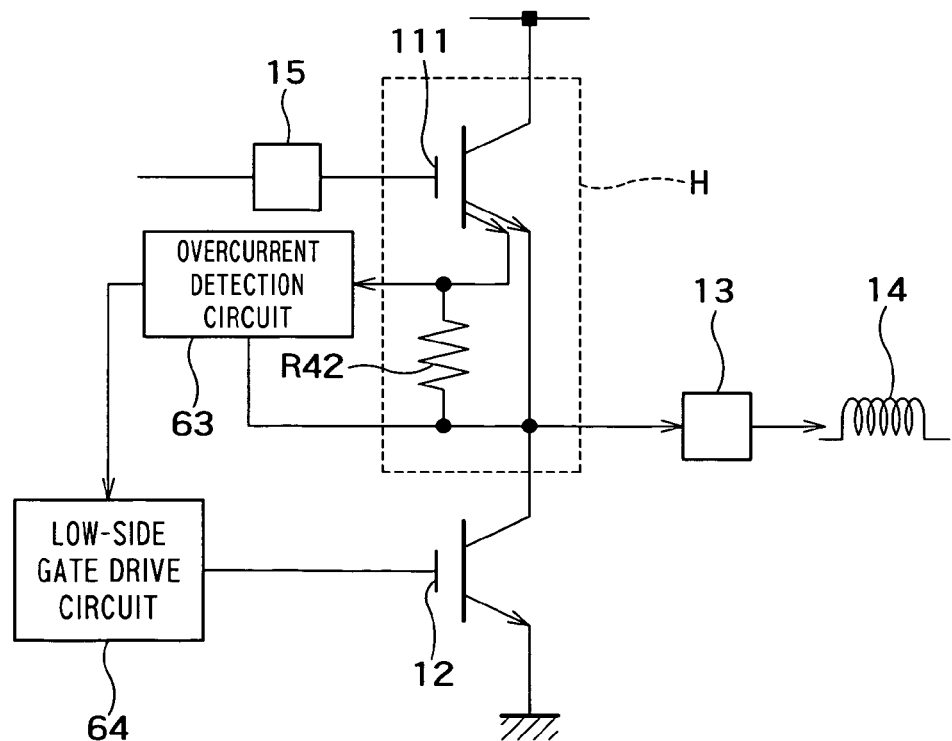
FIG. 8 is a block diagram showing still another example of the semiconductor module.
Figure 9:
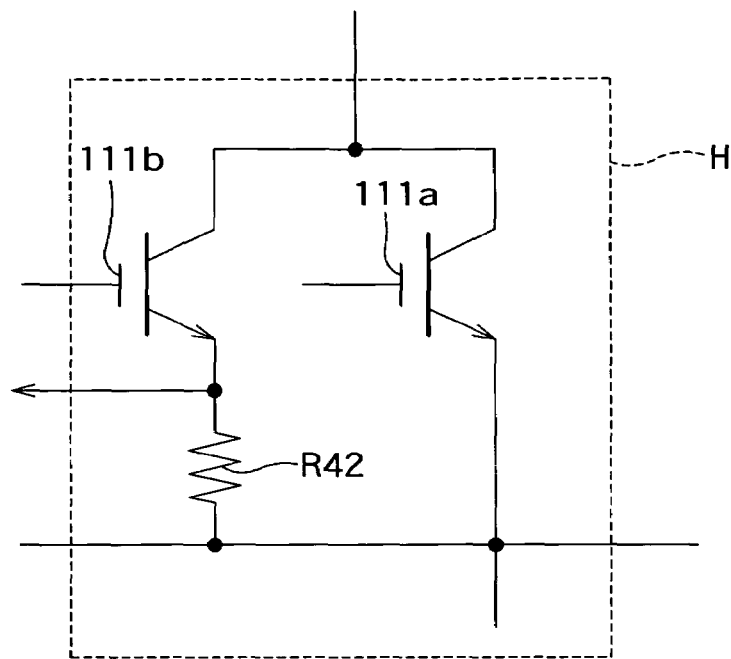
FIG. 9 is an equivalent circuit diagram of a circuit surrounded by a dotted line in FIG. 8.

As shown in FIG. 8 which shows still another example of the semiconductor module, it is also possible to connect a sense resistor R42 between an emitter of an IGBT 111 and a sense terminal of the IGBT 111 and detect a voltage across the sense resistor R42 by means of an overcurrent detection circuit 63 to detect an overcurrent. This configuration will be described in more detail. A portion H surrounded by a dotted line in FIG. 8 can be represented as a configuration shown in FIG. 9. In other words, the portion H can be represented by connecting a main IGBT 111a and a series connection composed of a sense IGBT 111b and a sense resistor R42 in parallel. If a current flowing through the main IGBT 111a increases, a current flowing through the sense resistor R42 also increases and a voltage across the sense resistor R42 increases. If this voltage exceeds a reference value, therefore, the overcurrent detection circuit 63 shown in FIG. 8 can judge that an overcurrent is occurring. The overcurrent detection circuit 63 may be included in a low-side gate drive circuit 64.

Figure 10:
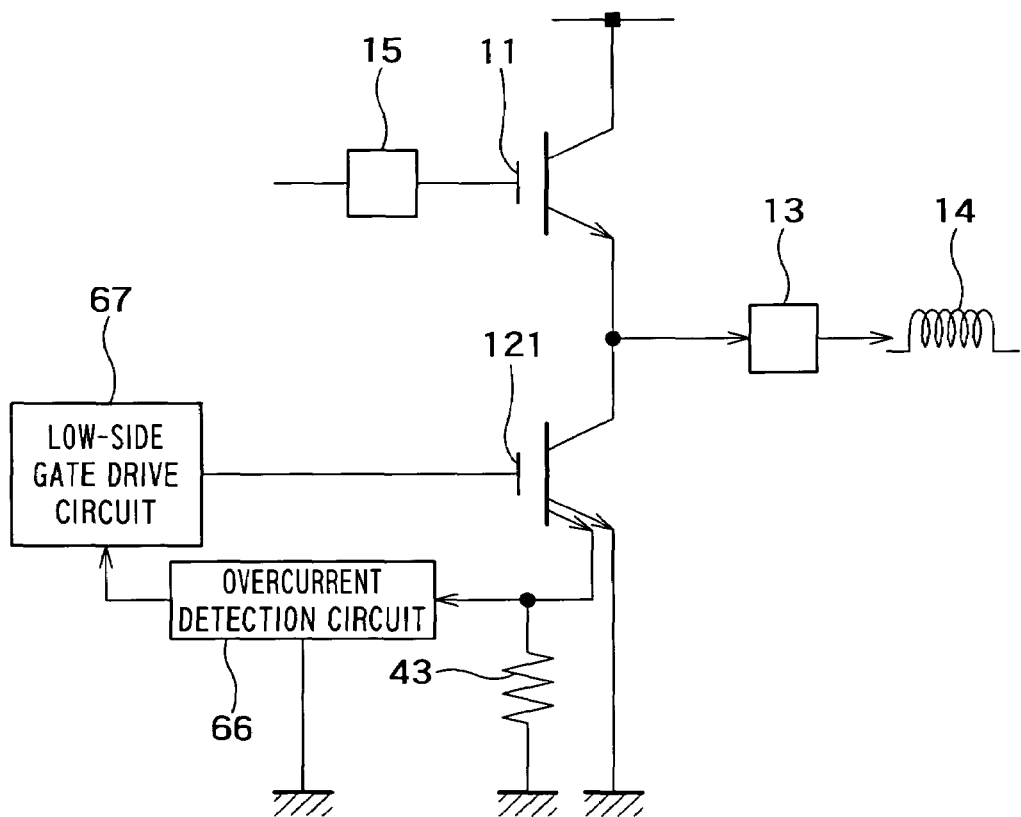
FIG. 10 is a block diagram showing yet another example of the semiconductor module.

As shown in FIG. 10 which shows yet another example of the semiconductor module, it is also possible to provide a sense resistor R43 between an emitter of the IGBT 121 and a sense terminal of the IGBT 121 and detect a voltage across the resistor R43 by means of an overcurrent detection circuit 66 to detect an overcurrent. The overcurrent detection circuit 66 may be included in a low-side gate drive circuit 67.

In the present embodiment, the low-side gate drive circuit has been described heretofore. However, the high-side gate drive circuit can also be formed in the same way. By the way, when applying the present embodiment to the high-side gate drive circuit, it is necessary to make alterations in design such as the disposition of the level shift circuit as appreciated by those skilled in the art.

The present embodiment has been described by taking IGBTs as drive elements. However, the present invention can also be implemented as, for example, a gate drive circuit for each of two NMOS transistors that are connected in series and that form a half bridge configuration.

In the present embodiment, MOS transistors are used as transistors forming the first switching element 24 and the second switching element 25. However, bipolar transistors may also be used. In this case, a PNP bipolar transistor is used instead of the PMOS transistor 28, and an NPN bipolar transistor is used instead of the NMOS transistor 29.

Furthermore, the present invention can also be implemented as a gate drive circuit for a lower side element among elements forming the push-pull configuration besides the half bridge configuration. Hereafter, this will be described.

Figure 11:
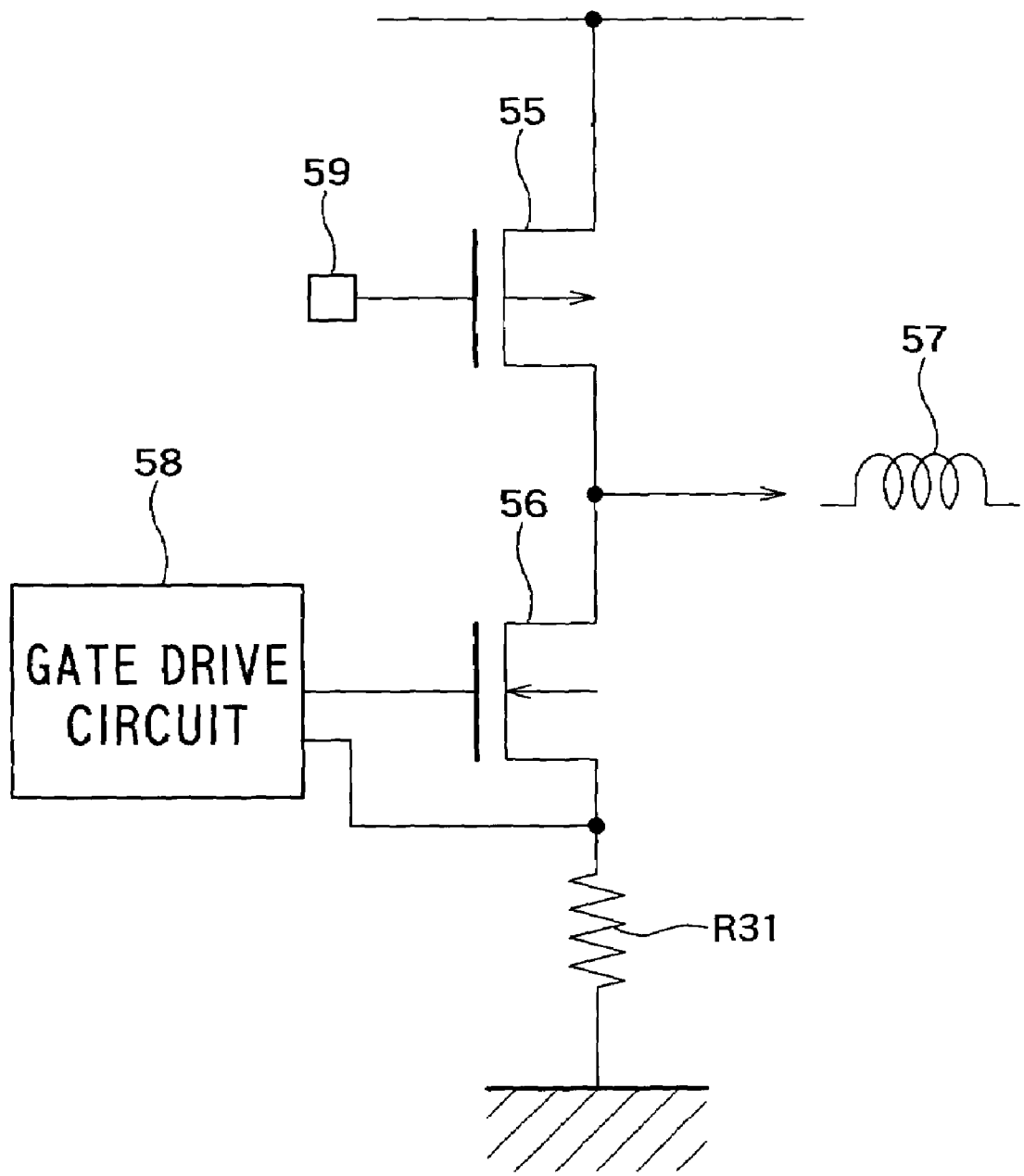
FIG. 11 is a circuit diagram showing an example of an embodiment of a gate drive circuit for a low-side element in a push-pull configuration.

FIG. 11 is a circuit diagram showing an example of a gate drive circuit for a low-side element in a push-pull configuration.

A PMOS transistor 55 on a high-side and an NMOS transistor 56 on a lower side are connected in series. A source side of the PMOS transistor 55 is connected to a power terminal. A drain side of the PMOS transistor 55 is connected to the drain of the NMOS transistor 56. A source side of the NMOS transistor 56 is connected to a ground terminal via an impedance R31. A load 57 such as a motor is connected to a node between the PMOS transistor 55 and the NMOS transistor 56 in the same way as FIG. 1. A gate drive circuit 58 which is an embodiment of the present invention is connected to the gate of the NMOS transistor 56. Reference numeral 59 denotes an output terminal of a high-side gate drive circuit.

As appreciated from the foregoing description, the present invention can also be implemented as the gate drive circuit for a low-side element that forms the push-pull configuration. In this case as well, effects similar to those obtained from the configuration shown in FIG. 1 can be obtained.

What is claimed is:

1. A gate drive circuit comprising:
    a first switching element connected at one end to a power terminal;
    a second switching element connected at one end to the other end of the first switching element and connected at the other end to a reference terminal;
    a gate voltage output terminal which supplies a voltage relating to a voltage at a node between the first switching element and the second switching element to a drive switching element as an output gate voltage;
    a gate voltage monitoring circuit which monitors the output gate voltage, and generates a gate voltage monitoring signal for indicating whether the output gate voltage is higher than a threshold voltage of the drive switching element;
    an overcurrent detection circuit which monitors a current through the drive switching element and generates an overcurrent monitoring signal for indicating whether an overcurrent is flowing through the drive switching element; and
    a control circuit which
        generates a control voltage input to a gate of the second switching element that sets an impedance of the second switching element to any one of a first impedance corresponding to an on-state, a second impedance corresponding to an off-state, or one or more other impedances between the first and second impedances, selectively, on the basis of an on/off signal for indicating that the drive switching element should be turned on/off, according to the gate voltage monitoring signal and the overcurrent monitoring signal, and
        supplies the generated control voltage to the gate of the second switching element.

2. The gate drive circuit according to claim 1, wherein
    in a case where the on/off signal indicates turn-off, the overcurrent monitoring signal indicates that the overcurrent is not flowing, and the gate voltage monitoring signal indicates that the output gate voltage is equal to or lower than the threshold voltage, the control circuit supplies a first control voltage to the gate of the second switching element as the control voltage input to the gate of the second switching element to set the second switching element to the first impedance corresponding to the on-state,
    in a case where the on/off signal changes from turn-off to turn-on while the first control voltage is being supplied, the control circuit supplies a second control voltage to the gate of the second switching element as the control voltage input to the gate of the second switching element to set the second switching element to the second impedance corresponding to the off-state, and
    in a case where the on/off signal changes from turn-on to turn-off while the second control voltage is being supplied, the control circuit supplies a third control voltage to the gate of the second switching element as the control voltage input to the gate of the second switching element to set the second switching element to a third impedance as said one or more other impedances which is higher than the first impedance and which is lower than the second impedance.

3. The gate drive circuit according to claim 2, wherein
    in a case where the gate voltage monitoring signal changes from a signal indicating that the output gate voltage is higher than the threshold voltage to a signal indicating that the output gate voltage is equal to or lower than the threshold voltage while the third control voltage is being supplied, the control circuit switches the control voltage supplied to the gate of the second switching element from the third control voltage to the first control voltage.

4. The gate drive circuit according to claim 2, wherein
in a case where the overcurrent monitoring signal changes from a signal indicating that the overcurrent is not flowing to a signal indicating that the overcurrent is flowing while the second control voltage is being supplied, the control circuit switches the control voltage supplied to the gate of the second switching element from the second control voltage to a fourth control voltage as the control voltage input to the gate of the second switching element to set the second switching element to a fourth impedance as said one or more other impedances which is higher than the first impedance and which is lower than the second impedance.

5. The gate drive circuit according to claim 4, wherein
in a case where the gate voltage monitoring signal changes from a signal indicating that the output gate voltage is higher than the threshold voltage to a signal indicating that the output gate voltage is equal to or lower than the threshold voltage while the fourth control voltage is being supplied, the control circuit switches the control voltage supplied to the gate of the second switching element from the fourth control voltage to the first control voltage.

6. The gate drive circuit according to claim 1, wherein the control circuit includes:
a voltage source;
a voltage divider circuit which has a plurality of impedance circuits and a plurality of switch circuits, and generates a divided voltage according to switch states of the switch circuits from a voltage supplied from the voltage source, the generated divided voltage being supplied to the gate of the second switching element as the control voltage; and
a control logic circuit which controls the switch circuits on the basis of the on/off signal, the gate voltage monitoring signal and the overcurrent monitoring signal.

7. The gate drive circuit according to claim 1, wherein the control circuit includes:
a logic circuit which generates an output logic signal from an input logic signal, a voltage level of the output logic signal depending upon a supplied operation voltage, the output logic signal being input to the gate of the second switching element as the control voltage;
a power supply circuit which has a voltage source, a plurality of impedance circuits and a plurality of switch circuits, and generates a divided voltage according to switch states of the switch circuits by using a voltage supplied from the voltage source, the generated divided voltage being supplied to the logic circuit as the operation voltage; and
a control logic circuit which generates the input logic signal to be input to the logic circuit and controls the switch circuits in the power supply circuit, on the basis of the on/off signal, the gate voltage monitoring signal and the overcurrent monitoring signal.

8. The gate drive circuit according to claim 1, wherein the control circuit includes:
a further switching element which forms a current mirror circuit with the second switching element;
a current generation circuit which has a plurality of current sources and a plurality of switch circuits and generates a current according to switch states of the switch circuits, the generated current being supplied to the further switching element; and
a control logic circuit which controls the switch circuits in the current generation circuit on the basis of the on/off signal, the gate voltage monitoring signal and the overcurrent monitoring signal.

9. A semiconductor module comprising:
a high-side drive switching element connected at one end to a first power terminal and connected at the other end to an output terminal to which a load is connected;
a low-side drive switching element connected at one end to the output terminal and connected at the other end to a first reference terminal; and
a gate drive circuit which controls on/off of the low-side drive switching element, the gate drive circuit including:
a first switching element connected at one end to a second power terminal;
a second switching element connected at one end to the other end of the first switching element and connected at the other end to a second reference terminal;
a gate voltage output terminal which supplies a voltage relating to a voltage at a node between the first switching element and the second switching element to the low-side drive switching element as an output gate voltage;
a gate voltage monitoring circuit which monitors the output gate voltage, and generates a gate voltage monitoring signal for indicating whether the output gate voltage is higher than a threshold voltage of the low-side drive switching element;
an overcurrent detection circuit which monitors a current through the low-side drive switching element and generates an overcurrent monitoring signal for indicating whether an overcurrent is flowing through the low-side drive switching element; and
a control circuit which
generates a control voltage input to a gate of the second switching element that sets an impedance of the second switching element to any one of a first impedance corresponding to an on-state, a second impedance corresponding to an off-state, or one or more other impedances between the first and second impedances, selectively, on the basis of an on/off signal for indicating that the low-side drive switching element should be turned on/off, the gate voltage monitoring signal and the overcurrent monitoring signal, and
supplies the generated control voltage to the gate of the second switching element.

10. The semiconductor module according to claim 9, wherein
in a case where the on/off signal indicates turn-off, the overcurrent monitoring signal indicates that the overcurrent is not flowing, and the gate voltage monitoring signal indicates that the output gate voltage is equal to or lower than the threshold voltage, the control circuit supplies a first control voltage as the control voltage for controlling impedance of the second switching element to the second switching element to set the second switching element to the first impedance corresponding to the on-state,
in a case where the on/off signal changes from turn-off to turn-on while the first control voltage is being supplied, the control circuit supplies a second control voltage as the control voltage input to the gate of the second switching element to set the second switching element to the second impedance corresponding to the off-state, and
in a case where the on/off signal changes from turn-on to turn-off while the second control voltage is being supplied, the control circuit supplies a third control voltage as the control voltage input to the gate of the second switching element to set the second switching element to a third impedance as said one or more other impedances which is higher than the first impedance and which is lower than the second impedance.

11. The semiconductor module according to claim 10, wherein
in a case where the gate voltage monitoring signal changes from a signal indicating that the output gate voltage is higher than the threshold voltage to a signal indicating that the output gate voltage is equal to or lower than the threshold voltage while the third control voltage is being supplied, the control circuit switches the control voltage supplied to the gate of the second switching element from the third control voltage to the first control voltage.

12. The semiconductor module according to claim 10, wherein
in a case where the overcurrent monitoring signal changes from a signal indicating that the overcurrent is not flowing to a signal indicating that the overcurrent is flowing while the second control voltage is being supplied, the control circuit switches the control voltage supplied to the gate of the second switching element from the second control voltage to a fourth control voltage as the control voltage input to the gate of the second switching element to set the second switching element to a fourth impedance as said one or more other impedances which is higher than the first impedance and which is lower than the second impedance.

13. The semiconductor module according to claim 12, wherein
in a case where the gate voltage monitoring signal changes from a signal indicating that the output gate voltage is higher than the threshold voltage to a signal indicating that the output gate voltage is equal to or lower than the threshold voltage while the fourth control voltage is being supplied, the control circuit switches the control voltage supplied to the gate of the second switching element from the fourth control voltage to the first control voltage.

14. The semiconductor module according to claim 9, further comprising:
an impedance circuit connected at one end to the other end of the low-side drive switching element and connected at the other end to the first reference terminal,
wherein the overcurrent detection circuit determines whether the overcurrent is flowing on the basis of a voltage across the impedance circuit.

15. The semiconductor module according to claim 9, further comprising:
an impedance circuit connected between the other end of the high-side drive switching element and the output terminal,
wherein the overcurrent detection circuit determines whether the overcurrent is flowing on the basis of a voltage across the impedance circuit.

16. A method for driving a switching element, comprising:
detecting a voltage relating to a voltage at a node between a first switching element and a second switching element as an output gate voltage, wherein the output gate voltage is supplied to a drive switching element, the first switching element is connected at one end to a power terminal, the second switching element is connected at one end to the other end of the first switching element and connected at the other end to a reference terminal;
monitoring whether the output gate voltage is or not higher than a threshold voltage of the drive switching element;
monitoring whether an overcurrent is or not flowing through the drive switching element;
generating a control voltage input to a gate of the second switching element that sets an impedance of the second switching element to any one of a first impedance corresponding to an on-state, a second impedance corresponding to an off-state, or one or more other impedances between the first and second impedances, selectively, on the basis of an on/off signal for indicating that the drive switching element should be turned on/off, a monitoring result of the output gate voltage indicating whether the output gate voltage is or is not higher than the threshold voltage and a monitoring result of the overcurrent indicating whether the overcurrent is or is not flowing; and
supplying the generated control voltage to the gate of the second switching element.

17. The method according to claim 16, wherein
the generating a control voltage includes:
in a case where the on/off signal indicates turn-off, the overcurrent is not flowing, and the output gate voltage is equal to or lower than the threshold voltage, generating a first control voltage that sets the second switching element to the first impedance corresponding to the on-state as the control voltage input to the gate of the second switching element,
in a case where the on/off signal changes from turn-off to turn-on while impedance of the second switching element is the first impedance, generating a second control voltage that sets the second switching element to the second impedance corresponding to the off-state as the control voltage input to the gate of the second switching element, and
in a case where the on/off signal changes from turn-on to turn-off while impedance of the second switching element is the second impedance, generating a third control voltage that sets the second switching element to a third impedance as said one or more other impedances which is higher than the first impedance and which is lower than the second impedance, as the control voltage input to the gate of the second switching element.

18. The method according to claim 17, wherein
the generating a control voltage further includes:
in a case where the output gate voltage changes from an higher value than the threshold to an equal to or lower value than the threshold voltage while impedance of the second switching element is the third impedance, switching the control voltage supplied to the gate of the second switching element from the third control voltage to the first control voltage.

19. The method according to claim 17, wherein
the generating a control voltage further includes:
in a case where a flowing of the overcurrent is detected while impedance of the second switching element is the second impedance, generating a fourth control voltage that sets the second switching element to a fourth impedance as said one or more other impedances which is higher than the first impedance and which is lower than the second impedance, as the control voltage input to the gate of the second switching element.

20. The method according to claim 19, wherein
the generating a control voltage further includes:
in a case where the output gate voltage changes from an higher value than the threshold voltage to an equal to or lower value than the threshold voltage while impedance of the second switching element is the fourth impedance, switching the control voltage supplied to the gate of the second switching element from the fourth control voltage to the first control voltage.

* * * * *